(12) United States Patent
Osuna et al.

(10) Patent No.: US 6,204,303 B1
(45) Date of Patent: Mar. 20, 2001

(54) SCREEN PRINTABLE CURABLE CONDUCTIVE MATERIAL COMPOSITION

(75) Inventors: Jesus E. Osuna, San Diego, CA (US); Keith M. Mason, Ocean City, MD (US); Vernon E. Stygar, San Diego, CA (US)

(73) Assignee: Ferro Corporation, Cleveland, OH (US)

( * ) Notice: Subject to any disclaimer, the term of this patent is extended or adjusted under 35 U.S.C. 154(b) by 0 days.

(21) Appl. No.: 09/408,568

(22) Filed: Sep. 28, 1999

Related U.S. Application Data

(62) Division of application No. 08/884,995, filed on Jun. 30, 1997, now Pat. No. 5,968,606.

(51) Int. Cl.$^7$ .............................. C08F 2/48; C08L 63/10; C08K 3/04; C08K 3/38
(52) U.S. Cl. .................... 522/71; 522/44; 522/46; 522/100; 524/404; 524/428; 524/496; 523/440
(58) Field of Search ................... 522/44, 46, 71, 522/100; 524/404, 428, 496; 523/440

(56) References Cited

U.S. PATENT DOCUMENTS

| | | | |
|---|---|---|---|
| 383,511 | 5/1888 | Ashcraft . | |
| 2,428,608 | 10/1947 | Bass | 174/35 |
| 3,354,123 | 11/1967 | Morgan | 269/65 |
| 3,882,033 | 5/1975 | Wright | 252/63.5 |
| 4,001,128 | 1/1977 | Penneck | 252/63.2 |
| 5,094,769 | 3/1992 | Anderson, Jr. et al. | 252/71 |
| 5,313,099 | 5/1994 | Tata et al. | 257/717 |
| 5,372,883 | 12/1994 | Shores | 428/323 |
| 5,572,070 | 11/1996 | Ross | 257/713 |
| 5,672,297 | 9/1997 | Soane | 252/511 |
| 5,968,606 | 10/1999 | Osuna et al. | 427/510 |

OTHER PUBLICATIONS

Copy of U.S. application No. 08/884,829 filed Jun. 30, 1997.
Copy of Derwent Abstract for JP 3–287668.
Copy of Derwent Abstract for JP 1–140506.

*Primary Examiner*—Tae Yoon
(74) *Attorney, Agent, or Firm*—Rankin, Hill, Porter & Clark LLP

(57) ABSTRACT

The present invention provides a novel UV curable composition for forming thermally conductive interface and a method of using the same. The composition is used to promote the transfer of heat from a source of heat such as an electronic device to a heat dissipation device such as a heat sink. The composition comprises by weight from about 35% to about 75% of a UV curable acrylate material, from about 0.5% to about 15% catalyst, from about 10% to about 30% hydrocarbon solvent and from about 20% to about 70% conductive filler.

11 Claims, No Drawings

SCREEN PRINTABLE CURABLE CONDUCTIVE MATERIAL COMPOSITION

RELATED APPLICATIONS

This application is a divisional application of application Serial No. 08/884,995 filed Jun. 30, 1997 now U.S. Pat. No. 5,968,606 entitled "Screen Printable UV Curable Conductive Material Composition."

FIELD OF THE INVENTION

This invention concerns an electronic material for use in connection with heat generating electronic devices. More particularly, this invention concerns a new coating material, containing thermally conductive particles such as boron nitride, for forming an improved thermally conductive layer and its method of application to a heat dissipation device for the purpose of transferring waste heat from an electronic heat generating source.

PRIOR ART

In the field of microprocessors and other types of electronic heat generating sources, it is well-known to use a thermally conducting organic interface material, filled with thermally conductive fillers or powders, as a heat transfer medium between a heat sink and the heat generating source. In particular, polysiloxane oils or polysiloxane elastomeric rubbers and thermoplastic materials such as PVC, polypropylene, etc. loaded with thermally conducting ceramics or other fillers such as aluminum nitride, boron nitride, diamond or zinc oxide have been used to impart thermally conducting properties to the organic phase.

In the case of polysiloxane oils loaded with thermally conducting materials, these materials are applied by smearing the heat sink or other electronic component with the thermally conducting paste and then securing the heat sink in place by mechanical means using clips or screws. In the case of polysiloxane rubbers and thermoplastic polymers, these materials are typically cast in sheet form and die cut into shapes corresponding to the shape of the heat sink and heat generating device. The resulting preform is then applied to the surface of the heat generating surface securing the heat sink by means of clips or screws.

Thermal greases are also used to conduct heat in electronic devices. The prior art thermal greases show superior film forming and gap filling characteristics between uneven surfaces thus providing an intimate contact between the surface of the heat sink and the surface of the heat generating source. However, it has been found that the use of thermal greases exhibit poor adhesions to the surfaces of the heat sink and heat generating surface, thus effectively seeping out from between the heat sink and the heat generating surface, causing air voids to form between the two surfaces leading to hot spots. Moreover, excessive pressure placed upon the heat sink by the mechanical fasteners accelerates this seepage from between the heat sink and the surface of the heat generating surface. It has been reported that excessive squeeze out of polysiloxane oils can evaporate and recondense on sensitive parts of the surrounding microcircuits. The recondensed oils lead to the formation of silicates thereby interfering with the function of the microprocessor and eventually causing failure.

The precut films solve the problems associated with greases but do not provide adequate intimate contact required for optimum heat transference between the heat generating source and the heat sink. Typical precut films do not show the film forming capacity as do the thermal greases. The added step of cutting preforms and manually applying the pad adds cost to the assembly process. Furthermore, these types of materials show variable performance due to variation in the thickness of the pad and the amount of pressure applied to the thermally conducting precut film, based upon the mechanical device or action used to secure the heat sink.

SUMMARY OF THE INVENTION

The present invention provides a new and improved composition for forming a thermally conducting polymeric interface layer or film for use in electronic applications, and a method of using such material. A suspension of thermally conducting filler is used to impart thermal conduction properties to the screen printable coating material system or gel. When cured, this thermally conducting thermal interface, being highly compressive, forms an intimate contact between the heat source and the heat sink. The material composition includes one or more UV curable acrylated materials that are cured via the use of catalysts and UV light into a highly compressible thermal interface. Since this material is a thermoset, no squeeze out of the material can occur subsequent to curing.

After the material composition is prepared, it is then screen printed to a film thickness onto the surface of a heat sink or other electronic component and then cured. The resultant film formed upon the heat sink or other device can be controlled to close tolerances, thereby imparting a consistent thickness and thereby allowing the uniform transfer of heat. The cured film being slightly compressive facilitates the touching of the particles of the thermally conductive filler and can conform to an uneven topography of the heat source. Typical prior art preform films do not have good compressibility, which results in poor intimate contact between the surface of the heat sink and the heat generating source. Because of the screenable nature of this material, variable die sizes can be quickly made up when using the thermal interface material of the present invention. The film formed by the interface material of the present invention is substantially noncorrosive and it will not creep or bleed-out under applied pressure.

An example of an application for which the composition of the present invention may be employed may be found in U.S. Pat. No. 5,313,099. The '099 reference which is incorporated herein by reference discloses a heat dissipating device such as a heat sink for use in connection with solid-state devices. The composition of the present invention would be utilized on the contact surfaces between the heat sink and the solid-state device in order to ensure the flow of heat from the device to the heat sink. In such an application the cured composition is sandwiched between the heat generating device and the heat dissipating device and such cured composition serves to facilitate the transfer of heat between the devices.

In a preferred embodiment the UV curable composition comprises by weight from about 35% to about 75% of a UV curable acrylate material, from about .5% to about 15% catalyst, from about 10% to about 30% hydrocarbon solvent and from about 20% to about 70% conductive filler. In order to be screen printable, the composition displays a viscosity of from about 5,000 to about 50,000 centipoise at 25° C. using a 1 RPM HBT (CP51). Also, upon curing the composition displays a modulus of from about 300,000 to about 600,000 at 25° C. and a thermal conductivity of at least 1.5 (W/m° K).

These and other aspects of the present invention will become clear to those skilled in the art upon the reading and understanding of the specification and the claims below.

DETAILED DESCRIPTION

The thermally conductive material composition of the present invention comprises a UV curable material, a catalyst, a thermally conductive filler and a hydrocarbon solvent.

Acrylate materials suitable for use in the present invention include polymers and monomers of acrylic acid or its esters including polymers and monomers of methyl methacrylate. Examples of suitable acrylate oligomer materials suitable for use in the present invention include, for example, bisphenol A epoxy acrylate, bisphenol diacrylate, polyester acrylate oligomer, acrylated epoxy linseed oil, acrylated epoxy soya oil, aliphatic urethane, acylata and acrylated, diacrylated, triacrylated and methoxy ether acrylates such as tetraethylene glycol dimethacrylate, and mixtures of the foregoing.

In addition to an acrylate oligomer, the composition also preferably includes an acrylate monomer. Examples of such monomers include monofunctional acrylates such as phenol ethoxylate monoacrylate, difunctional acrylates such as tripropylene diacrylate, and trifunctional acrylates such as trimethlolpropane ethoxylate triacrylate. Mixtures of the foregoing monomer materials may also be employed.

The composition also contains a hydrocarbon solvent. In addition to facilitating the screen printing of the composition, the solvent serves to facilitate the complete wetting of the conductive fillers. The solvent also allows high loading of the fillers in the material composition. High loading of the fillers provides superior heat transfer properties as well as superior physical properties. Examples of suitable hydrocarbon solvents include, for example, an aromatic hydrocarbon solvent sold under the trade designation Aromatic 100 by Union Carbide of Danbury, Conn. Another suitable hydrocarbon solvent includes the ISOPAR series of solvents sold by Exxon Chemical of Houston, Tex.

Examples of thermally conductive fillers suitable for use in the present invention include fine particles of boron nitride, aluminum nitride and diamond. Mixtures of such materials may also be utilized. The particle size of the fillers is important. The fillers must have an average particle size of less than about 40 microns. Preferably, the filler displays a bimodal distribution to enhance packing efficiency. Specifically, preferably, about 30% by volume of the particles display an average particle size of about 31 microns, and about another 30% by volume of the particles display an average particle size of about 12 microns. An example of a conductive filler suitable for use with the present invention is a boron nitride material sold under the trade designation Polartherm PT620 by Advanced Ceramics of Cleveland, Ohio.

It will be appreciated that the particular conductive filler that is utilized is generally a function of the particular application for the conductive composition including for example, the amount of heat that must be transferred from the heat generating electronic device.

The material composition also includes one or more catalysts or initiators. Photo initiators such as benzophenone or 2-2-dimethoxy-2 phenylacetonephenone may be utilized. Additionally, preferably, thermal initiators are included in the composition such as t-butyl perbenzoate or primary, secondary and tertiary amines.

An example of a material system suitable for use in the present invention that comprises an acrylate oligomer, acrylate monomer and a catalyst system is a material system sold under the trade designation Nor-Cote 80 by Nor-Cote International, Inc. of Crawfordsville, Ind.

Reaction (crosslinking) of the acrylate materials is initiated upon exposure to actinic light (UV light) between about 250–300 nanometers. Initiation of the free radical polymerization occurs upon absorption of light by the catalysts or initiators. In addition, thermal catalysts or initiators help to perpetuate the crosslinking reaction in shadow covered areas or areas blocked by the conductive filler. The curing parameter of the material composition depends on factors such as applied thickness, environmental conditions and energy levels of the light source. However, the material composition generally cures when exposed to a 200–300 watt UV source, such as that provided by mercury vapor lamps, in a few seconds.

Prior to curing, in order to ensure that the material composition is screen printable, it preferably displays a viscosity of from about 5,000 to about 50,000 centipoise at 25° C. using a IRPM HBT (CP51). The composition is capable of being applied at a thickness of from about 0.001" to about 0.005" with a tolerance of about 0.0005". Subsequent to curing, the cured composition preferably displays a modulus of from about 300,000 to about 600,000 at 25° C. After curing, the composition also displays a thermal conductivity of at least 1.5 (W/m° K) and a coefficient of thermal expansion of less than 40 ppm between –55° C. to 150° C. Subsequent to curing, the cured composition also displays a volume resistivity of at least about $0.5 \times 10^{15}$ Ohm×cm. However, it will be appreciated that the composition can be easily rendered electrically conductive by adding conductive metals such as silver or gold. In certain applications it may be advantageous to have a composition that is electrically conductive.

The material composition is easily prepared by mixing the various components in a conventional mixing device such as a Hobart mixer. During mixing, preferably any hydrocarbon solvent lost due to evaporation is replaced.

The following examples are intended only to illustrate the invention and should not be construed as imposing limitations upon the claims.

EXAMPLE I

The following compositions A-D were prepared as follows by mixing in a Hobart mixer at low speed for 20 minutes. During mixing, any hydrocarbon solvent lost due to evaporation was replaced.

|  | % By Weight | | | |
| --- | --- | --- | --- | --- |
| Component | A | B | C | D |
| Aliphatic urethane diacrylate | 11.3 | — | 19.8 | — |
| Aromatic acid methacrylate half ester | — | 19.8 | — | — |
| EO₃ trimethylol propane triacrylate | — | 3.9 | 3.9 | — |
| PO₂ neopentyl glycol diacrylate | — | 11.5 | 11.9 | — |
| Lauryl acrylate | 15.3 | — | — | — |
| Alpha hydroxy ketone | — | 2.0 | 2.0 | — |
| Benzophenone | — | 2.4 | 2.0 | — |
| Metallic diacrylate | 2.8 | — | — | — |
| Esacure KTO | 3.4 | — | — | — |
| Acrylate amine | 6.8 | — | — | — |
| Hydrocarbon solvent | 39.4 | 39.4 | 39.4 | 39.4 |
| Boron nitride | 20.9 | 20.9 | 20.9 | 20.9 |
| Nor-Cote 80 | — | — | — | 39.7 |

Formulations A–D displayed the following properties subsequent to mixing.

| Property | Formulation | | | |
|---|---|---|---|---|
| | A | B | C | D |
| *Viscosity | 10–15,000 | 10–15,000 | 10–15,000 | 10,000–15,000 |

*centipoise at 25° C. using 1 RPM HBT (CP51)

EXAMPLE II

The compositions of Example I were applied utilizing screen printing techniques to a metal substrate at a thickness of about .0015" and then cured in about 3 seconds using a conventional 300 watt UV light source.

While the invention has been explained in relation to its preferred embodiments, it is to be understood that various modifications thereof will become apparent to those skilled in the art upon reading this specification. Therefore, it is to be understood that the invention disclosed herein is intended to cover such modifications as fall within the scope of the appended claims.

What is claimed is:

1. A composition for use in preparing a heat conductive film having a thermal conductivity of at least 1.5 (W/m° K), said composition comprising by weight from about 35% to about 75% of a UV curable acrylate material, from about 0.5% to about 15% catalyst, from about 10% to about 70% hydrocarbon solvent and from about 20% to about 70% conductive filler.

2. A composition as set forth in claim 1 wherein said conductive filler comprises a material selected from the group consisting of boron nitride, aluminum nitride, diamond and mixtures thereof.

3. A composition as set forth in claim 1 wherein said acrylate material comprises a polymer or monomer of acrylic acid or its esters.

4. A composition as set forth in claim 3 wherein said acrylate material comprises an oligomeric material selected from the group consisting of a bisphenol A epoxy acrylate, a bisphenol diacrylate, a polyester acrylate, acrylated epoxy linseed oil, acrylated epoxy soya oil, an aliphatic urethane acrylate, a methoxy ether acrylate and mixtures thereof.

5. A composition as set forth in claim 4 wherein said acrylate material further includes an acrylate monomer.

6. A composition as set forth in claim 5 wherein said acrylate monomer comprises a material selected from the group consisting of phenol ethoxylate monoacrylate, tripropylene diacrylate, trimethlolpropane ethoxylate triacrylate and mixtures thereof.

7. A composition as set forth in claim 1 wherein said catalyst comprises a photo initiator selected from the group consisting of benzophenone, 2-2-dimethoxy-2 phenylacetonephenone and mixtures thereof.

8. A composition as set forth in claim 7 wherein said catalyst further includes a thermal initiator selected from the group consisting of primary amines, secondary amines, tertiary amines and mixtures thereof.

9. A composition as set forth in claim 1 wherein said conductive filler has an average particle size of less than 40 microns.

10. A composition as set forth in claim 1 wherein said conductive filler comprises a multitude of fine particles having a bimodal particle distribution.

11. A UV curable screen printable composition for forming a thermally conductive layer, said composition comprising a UV curable acrylate material, a catalyst, a hydrocarbon solvent, and from about 20% to about 70% by weight conductive filler and having a viscosity of from about 5,000 to about 50,000 centipoise at 25° C., said composition subsequent to curing having a thermal conductivity of at least 1.5 (W/m° K).

* * * * *